(12) United States Patent
Gasse et al.

(10) Patent No.: US 8,921,881 B2
(45) Date of Patent: Dec. 30, 2014

(54) LED COMPONENT WITH LOW RTH WITH DISSOCIATED ELECTRICAL AND THERMAL PATHS

(71) Applicant: Commissariat a l'Energie Atomique et Aux Ene Alt, Paris (FR)

(72) Inventors: Adrien Gasse, Grenoble (FR); Francois Levy, Claix (FR)

(73) Assignee: Commissariat a l'Energie Atomique et aux Energies Alternatives, Paris (FR)

( * ) Notice: Subject to any disclaimer, the term of this patent is extended or adjusted under 35 U.S.C. 154(b) by 0 days.

(21) Appl. No.: 13/848,938

(22) Filed: Mar. 22, 2013

(65) Prior Publication Data

US 2013/0256713 A1      Oct. 3, 2013

(30) Foreign Application Priority Data

Mar. 28, 2012  (FR) ...................... 12 52795

(51) Int. Cl.
*H01L 33/00* (2010.01)
*H01L 33/64* (2010.01)
*H01L 33/62* (2010.01)

(52) U.S. Cl.
CPC ............... *H01L 33/64* (2013.01); *H01L 33/62* (2013.01); *H01L 2224/48091* (2013.01); *H01L 2224/73265* (2013.01); *H01L 2924/19107* (2013.01)
USPC ................................ 257/98; 257/99; 257/100

(58) Field of Classification Search
USPC ............................................. 257/98, 99, 100
See application file for complete search history.

(56) References Cited

U.S. PATENT DOCUMENTS

| 2003/0015721 A1 | 1/2003 | Slater, Jr. et al. |
| 2004/0079957 A1 | 4/2004 | Andrews et al. |
| 2007/0246715 A1 | 10/2007 | Shin et al. |
| 2009/0227050 A1 | 9/2009 | Shin et al. |
| 2010/0227421 A1* | 9/2010 | Neff et al. ...................... 438/26 |
| 2011/0284909 A1* | 11/2011 | Sugizaki ........................ 257/99 |
| 2011/0297989 A1* | 12/2011 | Murai et al. ................... 257/98 |
| 2012/0056223 A1 | 3/2012 | Hsieh et al. |
| 2012/0091496 A1 | 4/2012 | Chien et al. |

FOREIGN PATENT DOCUMENTS

| CH | 202084524 U | 12/2011 |
| CN | 202084524 U | 12/2011 |

OTHER PUBLICATIONS

French Preliminary Search Report issued Nov. 30, 2012 in Patent Application No. 1252795 with English Translation of Category of Cited Documents.
French Preliminary Search Report issued Nov. 30, 2012, in French 1252795, filed Mar. 28, 2012 (with English Translation of Categories of Cited Documents).

\* cited by examiner

*Primary Examiner* — Tan N Tran
(74) *Attorney, Agent, or Firm* — Oblon, Spivak, McClelland, Maier & Neustadt, L.L.P.

(57) ABSTRACT

A component emitting light radiation comprising a vertical junction supported on a substrate, the face of the substrate opposite the face on which the junction is made is provided with at least one first conducting zone dedicated to electrical contact and a second conducting zone insulated from the substrate and from the first conducting zone, the second zone being dedicated to heat dissipation.

11 Claims, 6 Drawing Sheets

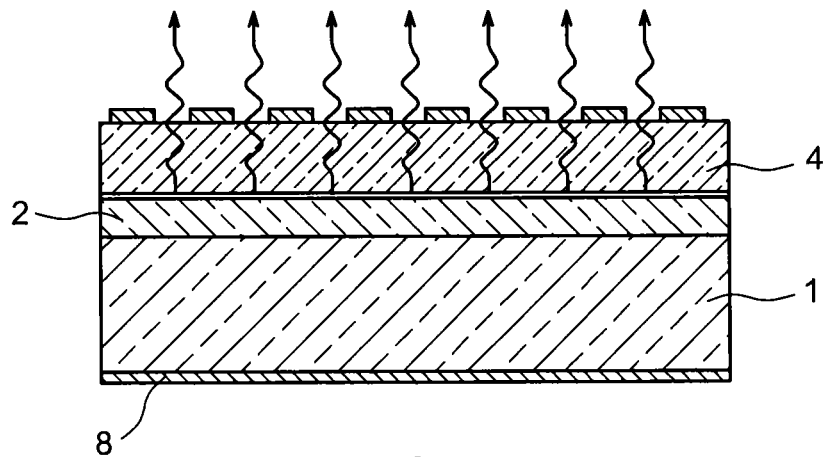
FIG. 1
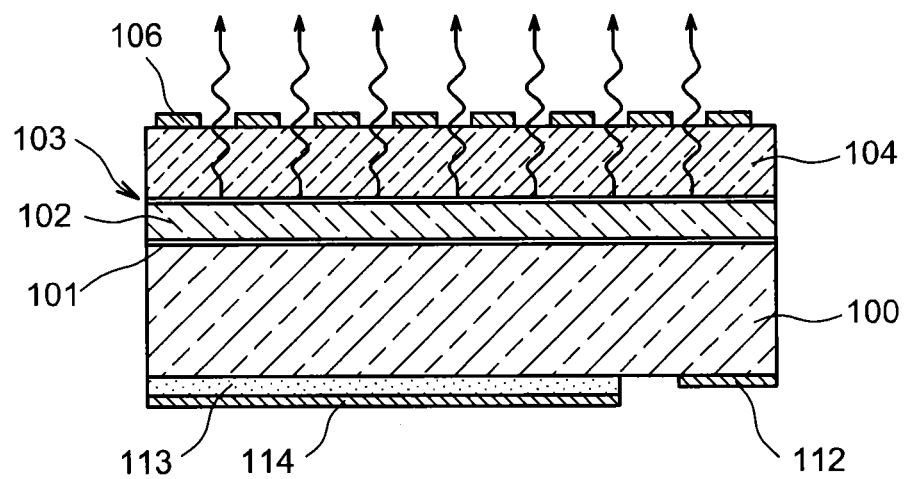
FIG. 3
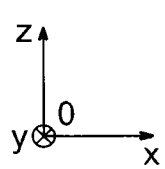

LED COMPONENT WITH LOW RTH WITH DISSOCIATED ELECTRICAL AND THERMAL PATHS

TECHNICAL FIELD

The invention relates to the field of microelectronics and more particularly to the fabrication of microelectronic devices emitting light radiation. The invention is aimed at making a microelectronic device emitting light radiation with improved heat dissipation.

PRIOR ART

A LED (Light Emitting Diode) chip usually includes at least one zone of semiconducting material doped with a p type doping and at least one zone of semiconducting material doped with an n type doping, the doped zones forming a junction, the active light emitting zone being intermediate between the two doped zones.

There are several configurations of LED chips depending on the arrangement of the junction and the electrical contact pads formed on this junction.

According to a first so-called "lateral" configuration, a LED chip may have contact pads arranged on a p-doped semiconducting zone and contact pads on an n-doped semiconducting zone, the p- and n-doped zones being located side by side on the same face of a support. This support may be a growth substrate, for example based on sapphire, on which doped semiconducting zones have been formed.

According to a so-called "vertical" configuration, the contact pads are arranged on each side of a junction comprising a p-doped semiconducting zone and a stacked n-doped semiconducting zone.

FIG. 1 shows an example of a LED chip with a vertical configuration.

This chip is formed from a conducting substrate 1, for example based on doped Si on which there is a first p-doped semiconducting layer 2 itself covered by a second n-doped semiconducting layer 4. The active light emitting zone is intermediate between the two doped zones 2 and 4. Furthermore, a metallic stack (not shown) is normally present between the substrate 1 and the p-doped layer 2 and performs electrical and heat conduction and optical reflection functions. One or several contact zones 6 are provided on the second n-doped semiconducting layer 4 to enable an electrical connection, while another contact zone 8 is provided on a face of the conducting substrate 1 opposite the face on which the first p-doped semiconducting layer 2 is formed.

The vertical configuration has the advantage that the contact zone 8 can cover the entire surface of the p-doped semiconducting layer so that the electrical and thermal contact resistance can be minimised.

In a vertical configuration, it is also advantageous to use a substrate different from the substrate on which this junction was made, as the junction support. A transfer substrate with good thermal resistance can thus be used.

Document US 2003/0015721 discloses an example component with a LED chip in a vertical configuration.

Heat dissipation in LED components must be optimised to prevent overheating of the junction.

For example, when a LED component is integrated on a motherboard, the thermal power generated by the component integrated on the motherboard is firstly evacuated by conduction through the chip substrate, and then through a transfer joint from the substrate to the component support, for example a metallic base when the support is a metallic package. Heat can then be dissipated by conduction through a transfer joint from the metallic package to the motherboard and then through the motherboard, through a transfer joint to a passive or active heat dissipation system.

In a LED chip with a vertical configuration like that shown in FIG. 1, the contact zone 8 usually forms a heat dissipation zone with the component support on which the substrate 1 is assembled.

This contact zone 8 is usually assembled with a metallic pad 21 of the support 20, itself electrically insulated from the other conducting zones of the support by means of an electrical insulation region of the support.

FIG. 2A shows an example integration of a LED component according to the state of the art on a support 20 comprising a ceramic package 22. In this example, the ceramic package forms the electrical insulation region of the support. However, such a ceramic package has poor heat dissipation properties.

One alternative to integration into a ceramic package is integration in which the support 20 is a board. With this technique shown in FIG. 2B and usually called "Chip On Board", the chip may be added onto a metallic pad 21 supported on an insulating layer 23, itself supported on a metallic support 24. Heat dissipation may be prejudiced if the insulation layer 23 is too thick.

Document CN202084524 discloses a light radiation emitting device with an add-on junction on a copper support with conducting zones that are all connected to the junction and are electrically insulated from each other through a dielectric covering part of the support.

Document US2007/0246715A1 discloses a device emitting light radiation with an add-on junction on a support, the support comprising conducting zones that are all electrically connected to the junction and enable electrical contact on this junction. The support is made of aluminium and it comprises a region for dissipating heat in order to improve heat dissipation, this region also acting as an electrical contact zone.

The problem of further improving heat dissipation from a microelectronic device emitting light radiation with a vertical configuration arises.

PRESENTATION OF THE INVENTION

This invention relates to a device emitting light radiation comprising a junction supported on a conducting substrate provided with a given face on which the junction is formed, and a face opposite said given face comprising at least one first conducting zone dedicated to an electrical contact and at least one second conducting zone insulated from the conducting substrate and said first conducting zone, the second conducting zone being dedicated to heat dissipation.

According to the invention, the microelectronic device emitting light radiation comprises a first doped semiconducting zone and a second doped semiconducting zone located on said first doped semiconducting zone and forming a junction with said first doped semiconducting zone, said junction being supported on a conducting substrate, at least one first region of the substrate being covered and in contact with a first conducting zone forming an electrical contact, at least one second region of the substrate being covered with a second conducting zone disjoined from said first conducting zone, said second conducting zone being a heat dissipation zone, said second region being covered with an electrical insulation zone intermediate between said substrate and said second conducting zone.

Thus, according to the invention, at least one first conducting zone of the device is dedicated to electrical conduction, and at least one second conducting zone of the device is dedicated to heat dissipation, the first conducting zone and the second conducting zone being electrically insulated from each other.

By dissociating electrical and heat conduction paths, a light emitting component arranged according to the invention can give improved heat dissipation while facilitating an electrical connection.

The second conducting heat dissipation zone is advantageously designed to occupy an area larger than the area occupied by said first conducting zone on the substrate.

This facilitates heat dissipation.

Advantageously, the second conducting zone is not electrically connected to the junction or to any other active component of the device.

Thus, the second conducting zone is dedicated solely to heat dissipation and is not used as an electrical contact zone. This thus improves dissociation between the thermal and electrical paths.

According to one possible embodiment of the device, the first doped semiconducting junction zone is arranged on and in contact with a first face of the conducting substrate, whereas the first conducting zone is arranged on and in contact with a second face of the conducting substrate opposite said first face, the device being also provided with one or several other conducting contact zones arranged on and in contact with the second doped semiconducting zone, said other conducting contact zones being distinct from said first conducting zone and said second conducting zone and not being electrically connected to either said first conducting zone nor said second conducting zone.

The thermal resistance of the electrical insulation zone between the conducting substrate and the second conducting zone dedicated to heat dissipation may be less than or equal to 5 K·mm$^2$/W, preferably 1 K·mm$^2$/W, and preferably 0.5 K·mm$^2$/W.

The thickness of said electrical insulation zone may be between 0.05 μm and 20 μm, preferably between 0.1 μm and 1 μm.

Said electrical insulation zone may also be based on a material with a thermal conductivity of more than 1 W/(m·K), and preferably more than 100 W/(m·K).

The electrical insulation zone may be based on a dielectric material.

There are several possible embodiments and this dielectric material may be silicon oxide, silicon nitride or silicon oxinitride.

According to one possible layout of the device emitting light radiation, said first region may be a peripheral region of a face of the substrate and said second region may be a central region of said face of the substrate, said first conducting zone forming an electrical contact arranged around said second conducting heat dissipation zone.

The device may also comprise a support assembled to the substrate.

According to one possible embodiment of the device in which the junction is supported on a first face of the substrate and in which the first conducting zone and the second conducting zone are located on a second face of the substrate opposite said first face, the first conducting zone and the second conducting zone may be assembled with a support.

A first conducting pad of the support may be assembled and connected to said first conducting zone forming an electrical contact. Said second conducting zone of the substrate may be assembled to a second pad. Furthermore, said second doped semiconducting zone may be connected to a third conducting pad of the support through the contact pad. The support then also comprises electrically insulation zones provided between said first conducting pad and said conducting pad, and between said second pad and said third conducting pad.

This invention further relates to a method for making a light emitting microelectronic device comprising the following steps, in the same order listed or in a different order:

formation of a first conducting zone on a first region of a given face of a conducting substrate, and a second conducting zone on a second region of said given face, said second conducting zone being supported on an electrical insulation zone and being disjoined with said first conducting zone, transfer, on another face of the substrate opposite said given face, of a stack formed from a first doped semiconducting zone and a second doped semiconducting zone placed on said first semiconducting zone, said first doped semiconducting zone and said second doped semiconducting zone forming a junction.

The second conducting heat dissipation zone is advantageously arranged so as to occupy an area on the substrate larger than the area occupied by said first conducting zone.

Advantageously, the second conducting zone is arranged so as not to be electrically connected to the junction or to any other active component of the device.

The method may also comprise a step consisting of assembling the first face of the substrate with a support, the first conducting zone being assembled with a first conducting pad of said support, the second conducting zone being assembled to a second pad of said support, said first conducting pad and said second pad being separated by at least one insulation zone.

The method may also comprise a step consisting of making a connection between a third conducting pad of said support and said second doped semiconducting zone, particularly by wiring with at least one conducting wire, said second pad and said third conducting pad being separated by an insulation zone.

BRIEF DESCRIPTION OF THE FIGURES

This invention will be better understood after reading the following descriptions of example embodiments given purely for information and in no way limitative, with reference to the appended drawings in which:

FIG. 1 shows an example of a chip emitting light radiation, according to prior art;

FIG. 3 shows an example of a chip emitting light radiation implemented according to the invention, provided with dissociated electrical connection means and heat dissipation means said electrical connection means and heat dissipation means being formed on the same face of a substrate;

Figure 2A:
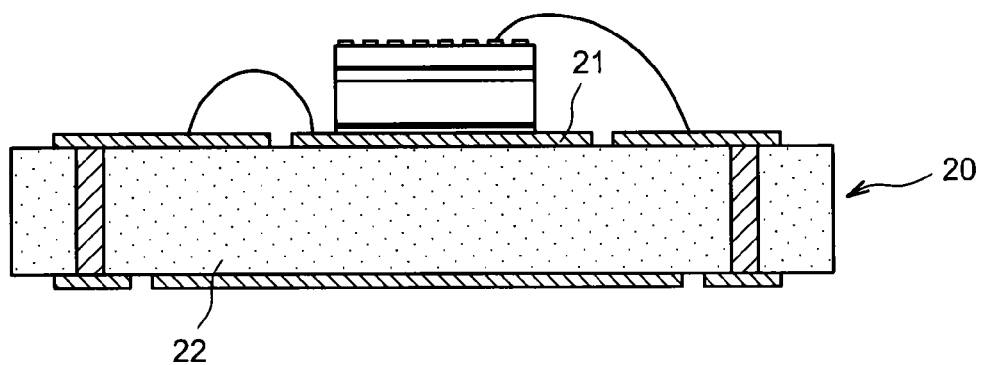
FIGS. 2A-2B show examples of assembly of the chip in FIG. 1 with different supports.
Figure 2B:
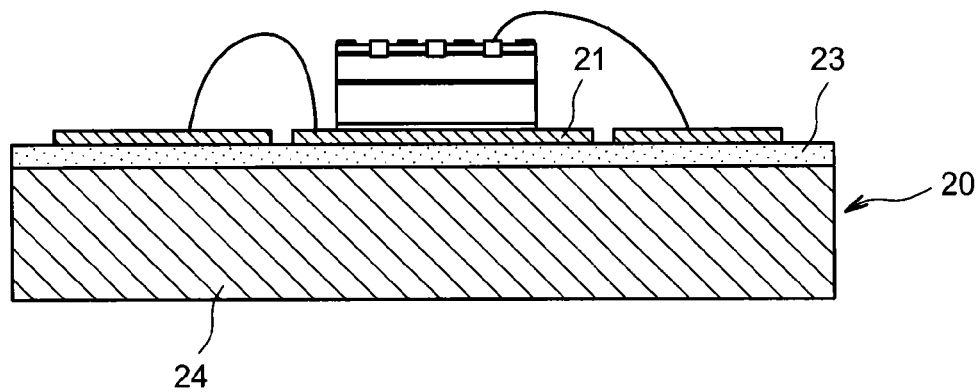

Identical, similar or equivalent parts of the different figures have the same numeric references so as to facilitate comparisons between the figures.

The different parts shown in the different figures are not necessarily drawn at the same scale, to make the figures more easily legible.

DETAILED PRESENTATION OF PARTICULAR EMBODIMENTS

One example of a light emitting device according to the invention is given in FIG. 3. This device comprises a LED chip in the vertical configuration.

This device is formed on a conducting substrate 100 and is for example based on a metal such as Cu or Ni, or a doped semiconductor for example based on Si or Ge or diamond or SiC or AlN.

According to another possibility, the substrate 100 may be based on a composite material based on several metals for example based on Cu and W, or Cu and Mo, or as a variant the substrate 100 can be based on a metal and a semiconductor, for example based on Al and Si, or Al and SiC.

The substrate material may be chosen so as to have a thermal conductivity of at least 1 W/(m·K), or preferably more than 100 W/(m·K).

A first face of the substrate 100 is covered with a metallic layer or stack 101 providing an electrical contact and acting as an optical reflector. This layer or this metallic stack 101 supports and is in contact with a semiconducting layer 102, for example GaN based and doped with a first type of doping, for example p-doped.

The metallic stack 101 thus provides an electrical connection between the first face of the substrate 100 and the semiconducting layer 102.

This semiconducting layer 102 is covered with another semiconducting layer 104, for example GaN doped with a second type of doping, for example n-doped, the layers 102 and 104 forming a junction. The active light emitting zone 103 is intermediate between the two semiconducting layers 102 and 104.

The semiconducting layers 102 and 104 are distributed such that the junction extends over the entire surface area of the first face of the substrate 100. In the example embodiment in FIG. 3, the area over which the junction extends measured in a plane parallel to the plane of the first face of the substrate 100, is approximately equal to the area of this first face of the substrate 100.

The n-doped semiconducting layer 104 can be covered with one or several electrical contact zones 106. These contact zones 106 may be metallic and for example may be based on an material suitable for making a contact on an n type semiconductor, for example a metallic stack based on Ti/Al/Ni/Au.

A second face of the substrate 100 opposite the first face comprises a first conducting zone 112 in contact with the conducting material of the substrate 100, in a first region. This first conducting zone 112 will form an electrical contact on the first face of the substrate 100 and can for example be based on a metallic material such as a Ti/Au stack in the case of a semiconducting substrate.

The first conducting zone 112 is thus electrically connected to the semiconducting layer 102 of the junction while the contact zones 106 are electrically connected to the semiconducting layer 104 of the junction.

In a second region of its second face, the substrate 100 comprises a second conducting zone 114 disjoined from the first conducting zone and that will form a heat dissipation zone. The second conducting zone 114 extends at least partly facing the junction, but is not electrically connected to the junction or to another active component of the device. The second conducting zone 114 may for example be based on a metallic material such as a Ti/Au stack in the case of a semiconducting substrate. The second conducting zone 114 is not in contact with the conducting material of the substrate 100.

The second conducting zone 114 is electrically insulated from the substrate by an electrical insulation zone 113.

The second conducting zone 114 may thus be completely separated from the substrate 100 by the dielectric material of the zone 113. Thus, the second semiconducting zone 114 may act as a heat dissipation zone without acting as an electrical contact zone on the chip or on a component.

The second conducting zone 114 forming a heat dissipation zone is distinct from the contact zones 106 and the first semiconducting zone 122, and is neither electrically connected to the contact zones 106 nor to the first semiconducting zone 112.

The electrical insulation zone 113 may be based on a non-doped semiconducting material, for example based on non-doped AlN or non-doped polycrystalline Si or non-doped diamond. The zone 113 may advantageously be based on a dielectric material such as silicon oxide, silicon nitride or silicon oxinitride, chosen to have low thermal resistance, and particularly a thermal resistance of not more than 5 K·mm$^2$/W. The thermal resistance of zone 113 is preferably less than or equal to 1 K·mm$^2$/W, and is preferably less than or equal to 0.5 K·mm$^2$/W. The thermal resistance is defined as the ratio between the thickness of zone 113 and the thermal conductivity of this zone 113.

While respecting this thermal resistance criterion, the thickness of said electrical insulation zone may be between 0.05 μm and 20 μm, preferably between 0.1 μm and 1 μm. Furthermore, the material in the zone 113 may have a thermal conductivity of more than 1 W/(m·K), and preferably more than 100 W/(m·K).

The result obtained is thus a light emitting device for which the electrical paths and the heat dissipation paths are dissociated.

The second conducting heat dissipation zone 114 may be designed to occupy an area on the substrate 100 larger than the area occupied by the first conducting zone 112 forming an electrical contact, to improve heat dissipation. The area occupied by the second conducting heat dissipation zone 114 on the substrate 100 may advantageously be at least 50% more than the area occupied by the first conducting zone 112 on the substrate 100 and preferably 80% more than that occupied by the first conducting zone 112.

Figure 4:
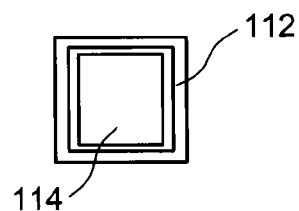
FIG. 4 shows an example of a particular arrangement according to the invention of dissociated electrical connection means and heat dissipation means formed on the same face of a substrate of a chip emitting light radiation.

According to one particular embodiment of the device (the chip being shown in a bottom view in FIG. 4), the second conducting zone 114 is arranged around the periphery of the second face of the substrate 100 and surrounds the first conducting zone 112 located at the centre of the second face of the substrate 100, the first conducting zone 112 and the second conducting zone 114 being distinct, in other words not being connected to each other.

The chip that has just been described may be arranged alone on a support. However, several chips may also be arranged on such a support, electrically interconnected in series and/or in parallel.

The substrate 100 may thus be assembled or transferred onto a support. Different examples of supports onto which the chip that has just been described can be transferred are given in FIGS. 5 and 6.

Figure 5:
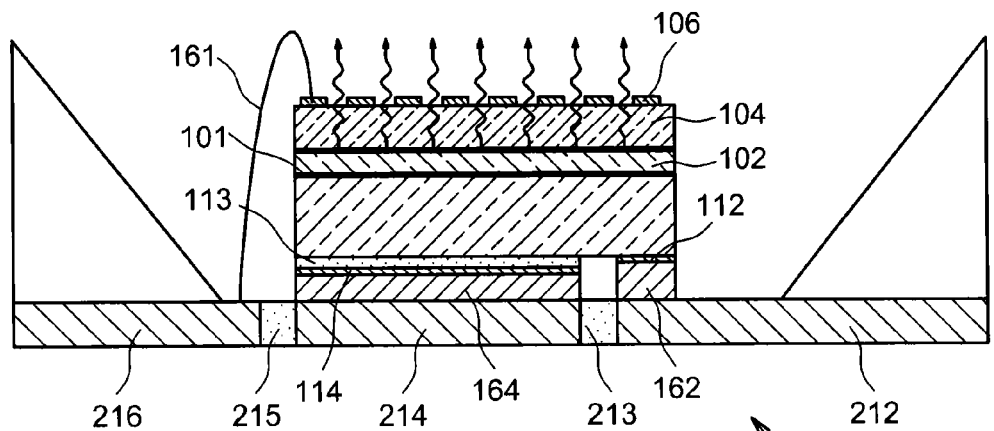
FIG. 5 shows an example of a device light emitting radiation device comprising a chip emitting light radiation like that is implemented according to the invention assembled to a support in the form of a metallic package.

FIG. 5 shows an example assembly of a chip emitting light radiation described above with a support 200 in the form of a metallic casing. The support 200 may be provided with disjoined metallic pads 212, 214, 216 insulated from each other by means of dielectric zones 213 and 215.

A metallic pad 212 of the support 200 is connected and assembled to the first conducting zone 112 of the chip, for example by means of a metallic material forming a solder joint 162.

Another metallic pad 214 of the support 200 is connected and assembled to the second conducting zone 114 of the chip, for example by means of a metallic material forming another solder joint 164.

Thus, the metallic pad 212 enables an electrical contact on the chip, while the other metallic pad 214 dissipates heat, the two pads 212 and 214 being electrically insulated from each other by the dielectric zone 213 separating them.

The support 200 also comprises another metallic pad 216 that is connected to the second doped semiconducting zone 104 of the chip. The connection may be set up by means of a metallic wire 161 and it may be made using a method commonly called "Wire bonding".

The metallic pad 216 is electrically insulated from the metallic pad 214 of the support 200 by the dielectric zone 215.

Figure 6:
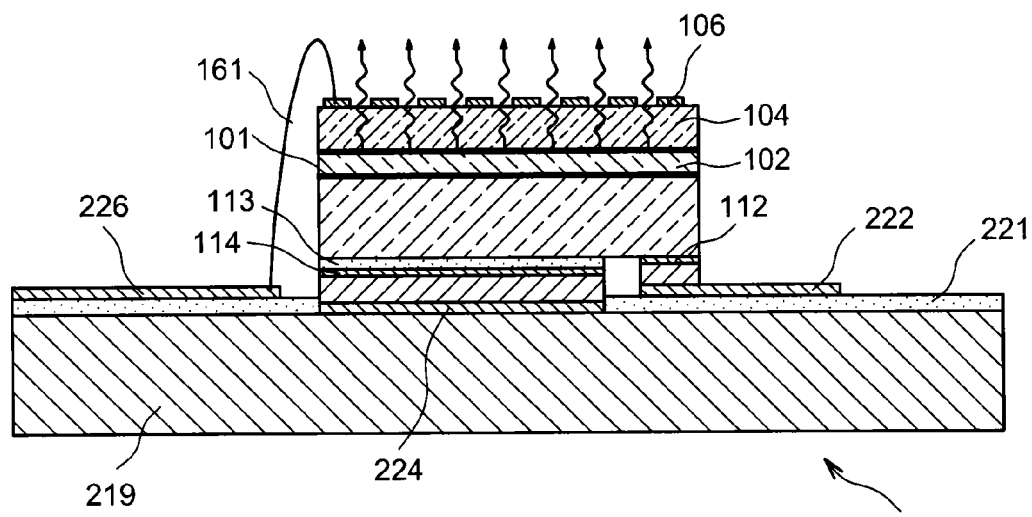
FIG. 6 shows an example of a light radiation emitting device comprising a chip emitting light radiation assembled to a support in the form of a board.

FIG. 6 shows another example assembly of the chip previously described with a support 202 that may be in the form of a board, for example an MCPCB (Metal Core Printed Circuit Board) type PCB. In this example, the support 202 may be formed from a metallic layer 219 covered by an insulating layer 221 that may be based on a dielectric material such as FR4 (standard material for printed circuits formed of glass fibres in an epoxy matrix), a polymer with a mineral particles filler to increase the thermal conductivity or an inorganic ceramic obtained either by deposition or by anodic oxidation of aluminium if the metallic layer 219 is aluminium.

In this example, the support 200 is provided with conducting pads 222, 226 that are supported on and are in contact with the insulating layer 221. The conducting pads 222, 226 and the metallic element 219 are thus electrically insulated from each other. The conducting pads 222, 226 of the support 200 are designed to set up an electrical contact with the first conducting zone 112 arranged on the first face of the substrate 100 and with a contact zone 106 located on the second face of the substrate 100.

There is a conducting pad 224 in contact with the metallic element 219 of the support 200 and with the second conducting zone 114 of the substrate 200.

The conducting pad 224 is designed to dissipate heat and it may be made from a material with a high thermal conductivity, for example a metal such as a bonding layer defined below and a stack comprising at least one of the metals among copper, nickel, silver and gold.

This pad 224 is insulated from the other conducting pads 222, 226 by means of the insulating layer 221, such that the heat dissipation and electrical conduction paths are also dissociated on the support 200.

We will now give an example of a method for fabricating a microelectronic light emitting device according to the invention of the type described above, with reference to FIGS. 7A-7H.

The initial material used in the method may be a conducting substrate 100 based for example on a metal such as Cu or Ni or a doped semiconductor, for example such as doped Si or doped Ge or doped diamond or doped SiC or doped AlN or based on a composite metallic material for example formed from Cu and W, or Cu and Mo, or based on a composite material formed from metal and a semiconductor, for example such as Al and Si, or Al and SiC. The thickness of the substrate 100 may for example be between 5 µm and 2000 µm.

The first step (FIG. 7A) is to form a layer 103 on the substrate 100 that is not electrically conducting and it may be based on a semiconducting non-doped material, or preferably a dielectric material such as silicon oxide, silicon nitride or even silicon oxinitride. The material in the layer 103 may also be chosen so as to have a low thermal resistance, in other words a resistance of not more than $5 K \cdot mm^2/W$, without changing its function of providing electrical insulation. The insulating layer 103 may for example be between 50 nanometers and 20 micrometers thick.

Figure 7A:
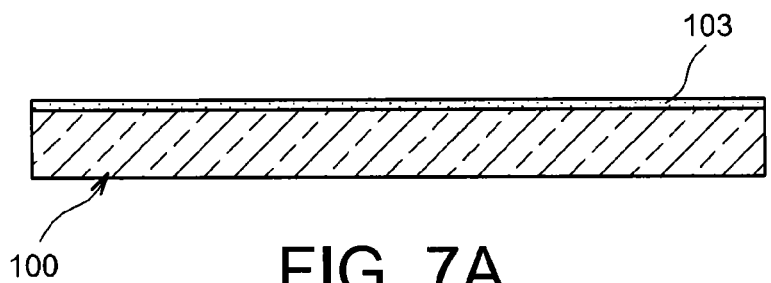
FIGS. 7A-7H show an example of a method for making microelectronic device emitting light radiation according to the invention.
Figure 7B:
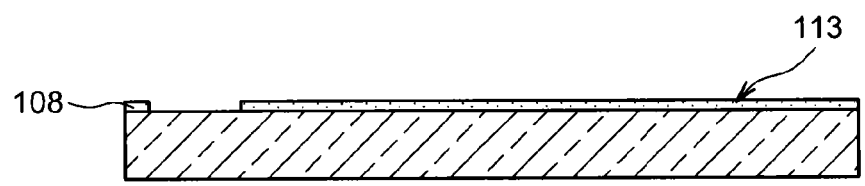
Figure 7:
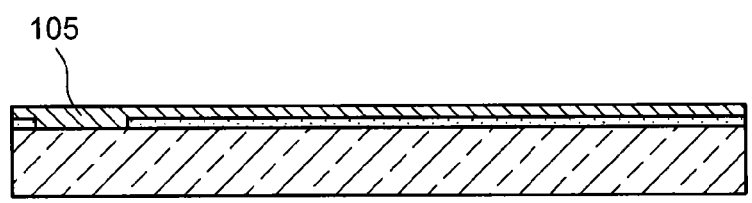

The layer 103 of the substrate 100 can then be etched in a first region of one face of the substrate, so as to expose this face locally to make contact on the substrate 100. The remaining portion of the layer 103 forms an electrical insulation zone 113 in a second region of said face of substrate 100 (FIG. 7B). An electrical insulating pad 108 remains around the border of the substrate, in the first region, in order to passivate the sides.

A conducting layer 105 is then formed with a thickness for example between 0.01 and 10 µm on the insulating layer 103 and the first region. The conducting layer 105 may comprise a layer of metallic bonding materials such as Ti, TiN, Cr, W, TiN, WN and a stack comprising at least one metal among copper, silver, nickel and gold (FIG. 7C).

Figure 7D:
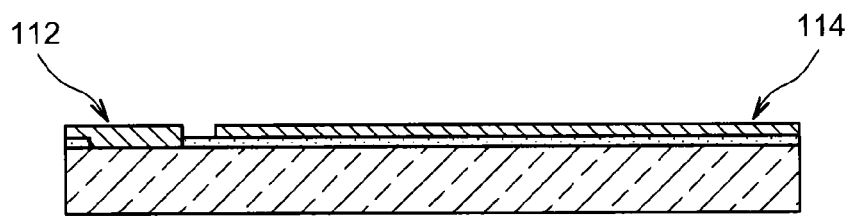

A portion of the conducting layer 105 is then etched in a zone located between said first region and said second region, so as to form a first conducting zone 112 in contact with the substrate 100 and a second conducting zone 114 supported on and in contact with the insulation zone 113, the first conducting zone 112 being disjoined from the second conducting zone 114 (FIG. 7D).

Figure 7E:
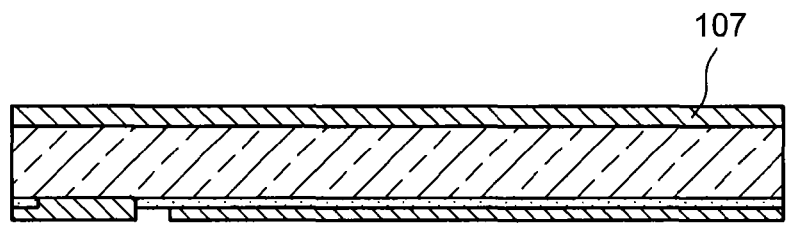
Figure 7:
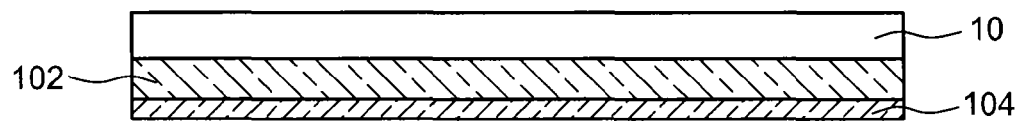
Figure 7:
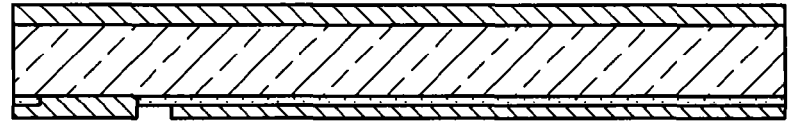

A bond layer 107 is then formed on the other face of the substrate 100 opposite the face on which the conducting zones 112, 114 were made. This bond layer 107 may for example be based on a metallic material such as Ti, TiN, Cr, W, TiN, WN and a stack comprising at least one metal among copper, silver, nickel and gold (FIG. 7E).

A junction can then be formed, in particular a vertical configuration junction of a light emitting diode on the substrate 100.

To achieve this, a stack of layers 10, 104, 102 comprising a doped semiconducting layer 104, for example with a p-type doping, covered and in contact with another doped layer 102, for example with an n-type doping, can be transferred onto the bond layer 107. The doped semiconducting layers 102, 104 may be made by growth on a growth substrate 10, for example based on sapphire (FIG. 7F).

The stack may also comprise the active light emitting zone intermediate between the p-doped semiconducting layer 104 and the n-doped semiconducting layer 102. The stack may also comprise one or several metallic layers 101 that will form an optical reflector and perform electrical and thermal conduction functions.

According to one possibility, the transfer may be made by brazing, for example Au and Sn, or Au and Si, or Au and In, or Au and Ge, or Pd and Ag, or Pd and In.

According to another possible embodiment, the transfer may be made by molecular bonding, for example between two copper zones or with materials comprising nano-particles of Ag or Au that can be sintered at low temperature.

This assembly can be made by remelting a solder alloy or by thermo-compression.

Figure 7G:
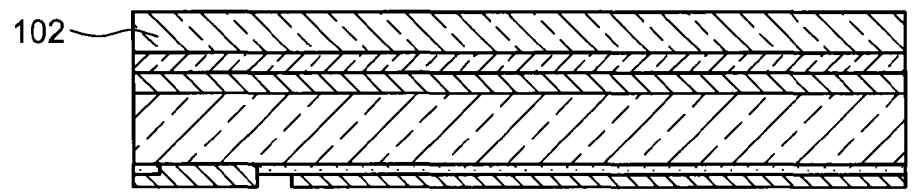

Once the bond layer 107 has been transferred onto the stack comprising the junction, the growth substrate 10 may be detached (FIG. 7G).

Detachment may be done for example using a laser lift-off (LLO) method, particularly in the case in which the substrate 10 is based on sapphire, or by thinning done by mechanical and/or chemical action, for example if the growth substrate 10 is based on Si.

The next step (FIG. 7H) is to form one or several contact zones 106 on the semiconducting layer 104, for example by deposition of a metallic material, for example such as a stack based on Ti, Al, Ni and Au, and then etching of this material using KOH to form a texture on the surface and thus improve extraction of light.

An insulating passivation of the chip edges may be done before or after the step that has just been described.

According to one possibility, the device for which the embodiment has just been described can then be cut into several chips or several components.

The device for which the embodiment has just been described may also be assembled with a support such as a component package or a board that will hold a plurality of components.

An assembly step between the substrate 100 and a metallic package type support 200 is illustrated for example in FIG. 5.

Figure 8:
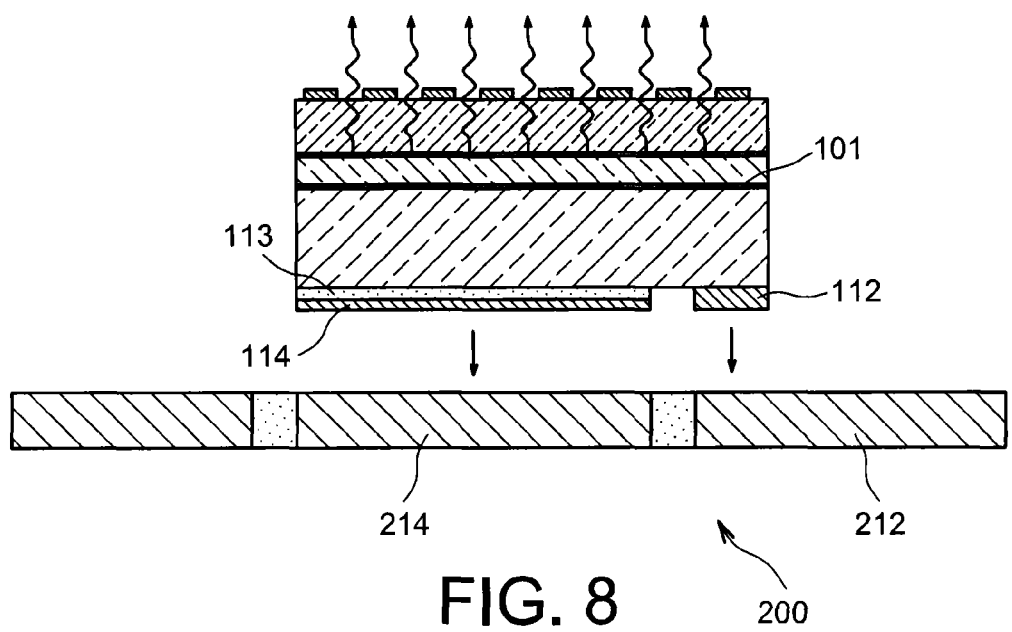
FIG. 8 shows an example assembly between a chip emitting light radiation as implemented according to the invention and a support.

This assembly may be made by adding metallic material on the support pads 212, 214. In the example shown in FIG. 8, the assembly is made without any added material in order to reduce the thermal and electrical resistance of the contacts.

According to one particular embodiment of the method, the conducting material in the initial substrate 100 may be a thick doped Si or Ge based semiconducting material.

A thinning step of the substrate 100 may possibly be used in this case, to reduce the thermal resistance, for example after formation of conducting zones 112, 114 on the opposite face described with reference to FIGS. 7D and 7E, and before formation of the bond layer described above with reference to FIG. 7E.

In this case, thinning may be done by chemical and/or mechanical polishing. The substrate 100 may be fixed on a temporary substrate acting as a handle substrate for this purpose. This can be made using a temporary adhesive on the face of the substrate comprising the conducting zones 112, 114.

According to another variant embodiment of the method, the assembly described above with reference to FIG. 7F and the thinning step can be done before the steps to produce the conducting zones 112 and 114.

The steps are then chained as follows: formation of the electrically insulating layer 103 (FIG. 7A); etching of the layer 103 to form the zone 113 (FIG. 7B); formation of the bond layer 107 (FIG. 7E); assembly (FIG. 7F), thinning, deposition of the conducting layer 105 (FIG. 7C), etching of the layer 105 (FIG. 7D). The assembly is then fixed onto a temporary handle substrate prior to removal of the growth substrate 10 (step 7G).

Figure 7H:
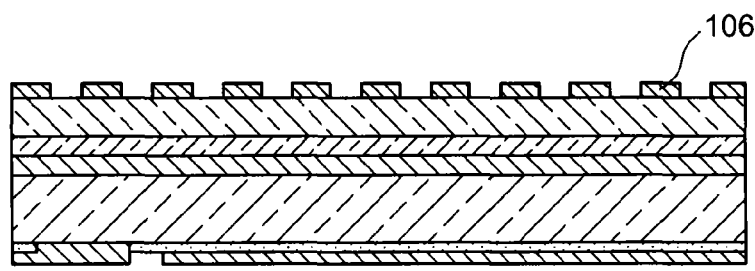

The method for making the LED leading to the structure shown in FIG. 7H is continued, and in the case of a handle substrate, the substrate may be removed for example before cutting and/or assembly of the elementary chips on the package support or the board.

The invention claimed is:

1. A microelectronic device emitting light radiation comprising:
a first doped semiconducting zone and a second doped semiconducting zone located on said first doped semiconducting zone and forming a junction with said first doped semiconducting zone, said junction being supported on a first face of a conducting substrate, at least one first region of a second face, opposite to the first surface, of the substrate being covered and in contact with a first conducting zone forming an electrical contact, at least one second region of the second face of the substrate being covered with a second conducting zone disjoined from said first conducting zone, said second conducting zone being a heat dissipation zone, said second region of the second face being covered with an electrical insulation zone intermediate between said second face of the substrate and said second conducting zone such that said second conducting zone does not contact any portion of the substrate, said second conducting zone occupying an area larger than the area occupied by said first conducting zone on the substrate, wherein the first conducting zone directly contacts the first region of the second face of the substrate without electrical insulation disposed between the first conducting zone and the first region of the second face of the substrate.

2. The microelectronic device according to claim 1, said second conducting zone not being electrically connected to said junction.

3. The microelectronic device according to claim 1, wherein
the device further being provided with one or several contact zones arranged on and in contact with the second doped semiconducting zone, said contact zones not being electrically connected to any of said first conducting zone or said second conducting zone.

4. The microelectronic device according to claim 1, wherein said first region is a peripheral region of the second face of the substrate and wherein said second region is a central region of said second face of the substrate, said first conducting zone forming an electrical contact arranged around said second conducting heat dissipation zone.

5. The microelectronic device according to claim 1, said electrical insulation zone has a thermal resistance of less than or equal to 5K·mm²/W.

6. The microelectronic device according to claim 5, said electrical insulation zone having a thickness of between 0.05 µm and 20 µm.

7. The microelectronic device according to claim 5, said electrical insulation zone being based on a material with a thermal conductivity of more than 1 W/(m·K).

8. The microelectronic device according to claim 7, said electrical insulation zone being based on a dielectric material such as silicon oxide, silicon nitride or silicon oxinitride.

9. The microelectronic device according to claim 1, the first conducting zone and the second conducting zone being assembled with a support.

10. The microelectronic device according to claim 9, wherein a first conducting pad of said support is assembled and connected to said first conducting zone, said second conducting zone of the substrate being assembled to a second pad, said second doped semiconducting zone being connected to a third conducting pad of the substrate, the support further comprising insulation zones provided between said first conducting pad and said second pad, and between said second pad and said third conducting pad.

11. The microelectronic system comprising a plurality of microelectronic devices according to claim 9, said devices being assembled on the same support, and interconnected to each other in series or in parallel.

* * * * *